March 12, 1974 T. S. TE VELDE 3,796,782

METHOD OF MANUFACTURING ELECTRONIC DEVICES, IN PARTICULAR SEMICONDUCTOR DEVICES

Original Filed Oct. 2, 1968

INVENTOR.

TIES S. TE VELDE

BY

Frank R. Trifari

AGENT

United States Patent Office 3,796,782
Patented Mar. 12, 1974

3,796,782

METHOD OF MANUFACTURING ELECTRONIC DEVICES, IN PARTICULAR SEMICONDUCTOR DEVICES

Ties Siebolt Te Velde, Emmasingel, Eindhoven, Netherlands, assignor to U.S. Philips Corporation, New York, N.Y.

Continuation of abandoned application Ser. No. 764,579, Oct. 2, 1968. This application May 13, 1971, Ser. No. 143,213
Claims priority, application Netherlands, Oct. 5, 1967, 6713531
Int. Cl. H01c *17/00*
U.S. Cl. 264—104 4 Claims

ABSTRACT OF THE DISCLOSURE

The manufacture of a semiconductor device comprising a thin layer of active grains bound together by an insulating material. Polyester binders, especially polyurethane binders are described, which are etched by saponification using an alcoholic lye solution to expose the grain surfaces for receiving electrical charge transport means.

Figure 1:
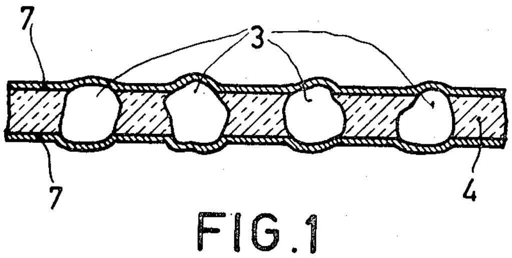

This is a continuation of application Ser. No. 764,579, filed Oct. 5, 1968 and now abandoned and claims priority on Dutch application No. 6713531, filed Oct. 5, 1967.

The invention relates to a method of manufacturing an electric device comprising an insulating plastics foil in which electrically active grains are embedded which protrude free of the insulating material on at least one side of the foil, on which side the foil is provided with an electrode, characterized in that the foil is formed by embedding the grains in a polyester and exposing grain surface parts by superficial etching off the polyester with the aid of an alcoholic lye solution, after which the electrode is applied.

It is known to use a foil of the kind set forth or parts thereof as diodes and resistors and, as far as the grains consist of semiconductor material capable of being opto-electrically operative, also as photo-diodes, photo-resistors, photo-E.M.F.-cells (solar batteries) and pn-light sources.

The term "opto-electrically operative semiconductor materials" has to be understood to denote materials whose electrical properties are affected by the supply of radiation or which produce radiation by the supply of electrical energy.

In the said devices, in accordance with the use, the grains may consist of different materials such as for instance silicon, silicon carbide, lead sulphide, cadmium sulphide and cadmium selenide, with or without additions determining the conductivity. Moreover, grains of very different dimensions may be used mostly lying between a few millimeters and a few microns.

In known methods the grains are spread on a substrate in a single layer of the thickness of one grain and then embedded in a film of liquid plastics, or pressed into a plastics foil, if necessary in the hot state.

In a further known method the substrate is provided with a readily soluble adhesive layer, for example, consisting of a solution of sugar or gelatin. The grains are applied thereto and embedded in a plastics layer. After the removal of the substrate by removing the adhesive layer a foil is obtained, where the grains project freely from one surface.

Processing the foils obtained by these known methods to form semiconductor devices frequently involves the problem that plastics-coated grain surfaces have to be freed in order to apply electrodes to them.

It is known to achieve this by abrasion, solution or etching of the local insulating material.

Abrasion of the surfaces involves practical difficulties which increase according as the foil surface is larger and the thickness of the foil is smaller. Moreover, owing to the ever present differences in the thickness of the grains it is likely that smaller grains are not freed at their surfaces, whereas larger grains may be seriously damaged.

The superficial solution of the insulating plastics has the disadvantage that the solution is attended with swelling of the subjacent foil material so that the definition of the free grain surfaces is not sharp. Moreover, after the termination of this treatment the dissolved substance may settle readily, be it in a thin layer, on the freed grain surfaces so that the application of satisfactory contacts cannot be carried out without the need for further means.

In etching, which is distinguished from the dissolving process in that the plastics are chemically dissociated, harmful swelling is less troublesome, but the resultant decomposition products left on the grains have, in general, to be removed by a separate treatment. This may sometimes be achieved by means of a solvent in which the original plastics are not soluble and the decomposition products are soluble, but this process is a further complication.

The invention has for its object to mitigate the disadvantages inherent in the known methods.

The invention is based on the recognition of the fact that among the many known synthetic resins suitable for composing the foil concerned a restricted group of substances is found which can be readily etched in a given liquid and whose decomposition products are soluble in this liquid.

This applies to all synthetic resins containing the groups $$-\underset{\underset{O}{\|}}{C}-O-,\quad -O-\underset{\underset{O}{\|}}{C}-O-\quad \text{or}\quad -NH-\underset{\underset{O}{\|}}{C}-O-,$$

which resins are known as polyesters, and may all be readily saponified by aqueous or alcoholic lye solutions containing KOH or NaOH in the range between about 1 and 10 percent by weight.

According to the invention a method as described in the preamble, is characterized in that the foil is formed by embedding the grains in a polyester and exposing the surfaces of the grains by superficially etching off the polyester by means of an alcoholic lye solution, after which the electrode is applied.

In this way the advantages of an etching treatment for freeing grain surfaces over abrasion or solution are completely maintained, and the usual, complicating, additional step of removing the etching products from the surfaces is dispensed with since the decomposition products dissolve in the etchant. It has furthermore been found that in this way the size of the exposed grain surfaces can be controlled more accurately by the duration of the treatment than in the case of abrasion or solution. It should be stated that the electrode applied to the grains may be a material electrode. There also exist other means of charge carrier transport providing a flow of charge carriers to the grains, such as for instance an electrolyte solution, an ion- or electron beam, etc.

Very good results are obtained by using resins containing the group $$-NH-\underset{\underset{O}{\|}}{C}-O$$

known as polyurethanes for composing the foil. The products obtained by this material have the special advantages of a high mechanical resistance and flexibility of the foil, a satisfactory adhesion to grains and a low sensitivity to humidity.

The invention will now be described more fully with reference to an example and the drawing, in which FIG.

Figure 2:
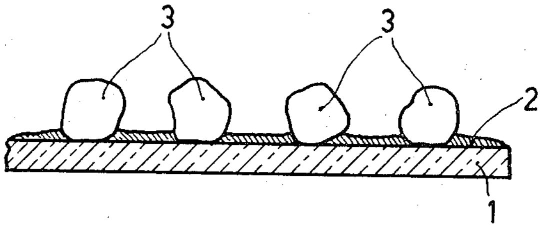
Figure 3:
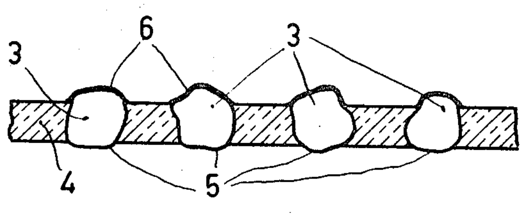

1 is a schematic cross sectional view of a photo-sensitive semiconductor device manufactured by the method according to the invention and FIGS. 2 and 3 are schematic cross sectional views of the device of FIG. 1 in successive stages of manufacture.

EXAMPLE

As is shown schematically in a sectional view in FIG. 2 of the accompanying drawing, a glass substrate 1 is provided with a thin, adhesive gelatin layer 2. Grains 3 of cadmium sulphide of a thickness of 40$\mu$ are spread thereon and the nonsticking grains are removed so that a one-grain thick layer is left.

After drying of the layer the substrate 1 is dipped in a polyurethane solution obtained by mixing 50 g. of the commercial product "Desmofeen 1200" with 42 g. of methylacetate and adding thereto 62.5 g. of the commercial product "Desmodur L."

"Desmofeen 1200" contains a saturated polyester obtained by poly condensation of adipine acid, trihydroxypropane and butylene glycol. "Desmodur L" contains the addition product of 2,2-dioxymethylbutanol-1 with a mixture of 2,4-toluenediisocyanate and 2,6-toluenediisocyanate (65:35).

After drying and hardening for about half an hour at 150° C. the composite layer is removed from the substrate and the gelatin layer is washed off.

The result is a foil of the construction shown schematically in FIG. 3 in a sectional view. The cadmium sulphide grains 3 are then embedded in a polyurethane layer 4 so that their free surfaces 5 of the grains protrude from the surface of the foil where the gelatin is removed.

In order to free the grain surfaces 6 on the other side of the foil, the foil is etched by saponification by a 5% in weight KOH solution in ethanol. After a few minutes already a sufficient extent of etching is attained, which is checked by means of a microscope.

The foil is then rinsed in ethanol and in running water. Finally, after drying, hardening is performed for one and a half hours.

The foil-shaped, photo-conductive device can then be obtained by applying to both sides (see FIG. 1) ohmic contact layers 7 by the vapor deposition of an alloy of gold with a few percent of indium.

It will be clear that the invention is not restricted to the given example, but that within the scope of the invention many varations are possible. Other materials may be used for the grains, other polyesters may be used as a binder and different alcoholic lye solutions may be used for the superficial etching, the etching temperature and further ambient parameters being adequately chosen by the worker skilled in the art.

What is claimed is:

1. A method of manufacturing an electrical device comprising the steps of embedding a layer of electrically active grains of a material in a synthetic polyester resin containing one of the following groups:

$$-\underset{\underset{O}{\|}}{C}-O-,\quad O-\underset{\underset{O}{\|}}{C}-O-,\ \text{and}\ -NH-\underset{\underset{O}{\|}}{C}-O-,$$

saponifying the portion of the synthetic polyester resin covering the surface of the grains with an alcoholic lye solution to remove the same, and applying a charge-carrier transport element over the exposed surface of the grains.

2. A method as claimed in claim 1, wherein the electrically active grains consist of a semiconductor material.

3. A method as claimed in claim 2, wherein the grains are embedded in a polyurethane.

4. A method as claimed in claim 3, wherein the etching solution consists of a 5% by weight KOH solution in ethanol.

References Cited

UNITED STATES PATENTS

| | | | |
|---|---|---|---|
| 2,904,613 | 9/1959 | Paradise | 156—17 |
| 3,423,338 | 1/1969 | Sutton | 260—2.5 AX |

ROBERT F. WHITE, Primary Examiner

G. AUVILLE, Assistant Examiner

U.S. Cl. X.R.

264—317